(12) United States Patent
Ciovacco et al.

(10) Patent No.: US 7,214,596 B2
(45) Date of Patent: May 8, 2007

(54) METHOD FOR THE FABRICATION OF ISOLATION STRUCTURES

(75) Inventors: Francesco Ciovacco, Milan (IT); Roberto Colombo, Lentate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 73 days.

(21) Appl. No.: 10/909,749

(22) Filed: Aug. 2, 2004

(65) Prior Publication Data
US 2005/0026389 A1    Feb. 3, 2005

(30) Foreign Application Priority Data
Aug. 1, 2003    (IT)    ............... MI2003A1591

(51) Int. Cl.
*H01L 21/76* (2006.01)
*H01L 21/336* (2006.01)
*H01L 21/4763* (2006.01)

(52) U.S. Cl. .............. 438/424; 438/296; 438/435; 438/637

(58) Field of Classification Search ........... 438/221, 438/296, 435, 219, 424, 636–638
See application file for complete search history.

(56) References Cited

U.S. PATENT DOCUMENTS

| 6,265,779 | B1 * | 7/2001 | Grill et al. ............... 257/759 |
| 6,815,333 | B2 * | 11/2004 | Townsend et al. ......... 438/623 |
| 6,914,004 | B2 * | 7/2005 | Thompson ............... 438/700 |
| 6,964,913 | B2 * | 11/2005 | Dong et al. .............. 438/437 |

\* cited by examiner

*Primary Examiner*—Chuong Anh Luu
(74) *Attorney, Agent, or Firm*—Lisa K. Jorgenson; Allen, Dyer, Doppelt, Milbrath & Gilchrist, P.A.

(57) ABSTRACT

A method for manufacturing insulating structures in a semiconductor substrate includes forming a first insulating layer on the semiconductor substrate, forming a stop layer on the first insulating layer, and forming a barrier layer on the stop layer. The barrier layer is selective with respect to the stop layer. A screen layer is formed on the barrier layer. A portion of the screen layer is selectively removed for forming an opening therethrough for exposing a portion of the barrier layer. The exposed barrier layer is removed for exposing a portion of the stop layer. The exposed stop layer is removed for exposing a portion of the semiconductor substrate. The method further includes removing the remaining barrier layer, and removing a portion of the exposed semiconductor substrate for forming a trench therein.

15 Claims, 5 Drawing Sheets

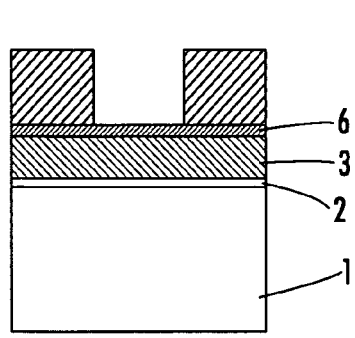
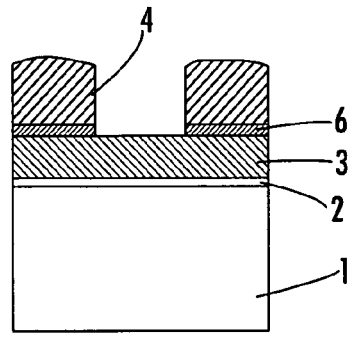
FIG. 21 (PRIOR ART)    FIG. 22 (PRIOR ART)
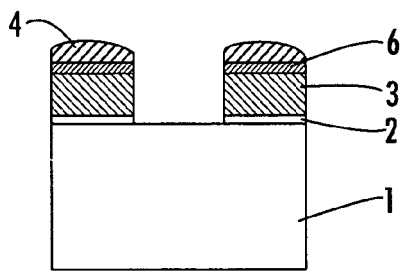
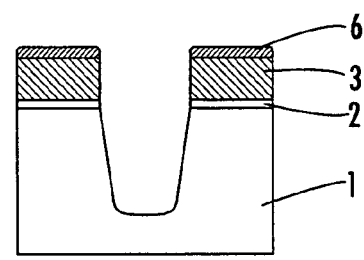
FIG. 23 (PRIOR ART)    FIG. 24 (PRIOR ART)
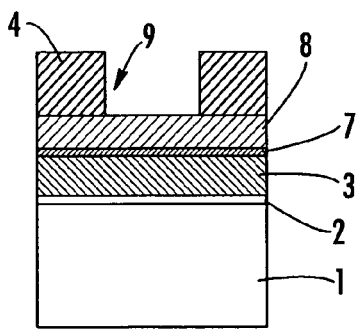
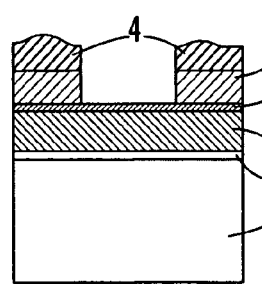
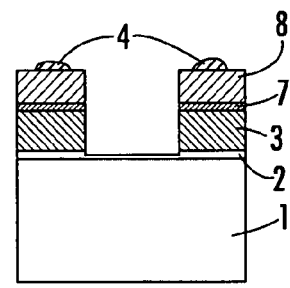
FIG. 25    FIG. 26    FIG. 27
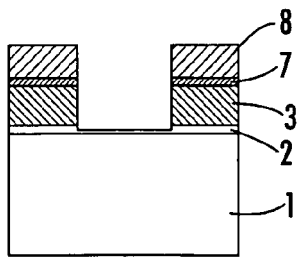
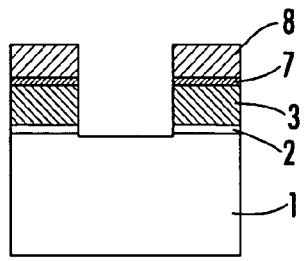
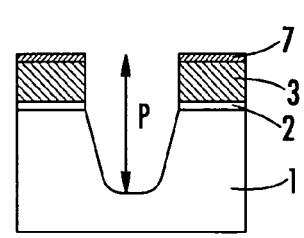
FIG. 28    FIG. 29    FIG. 30

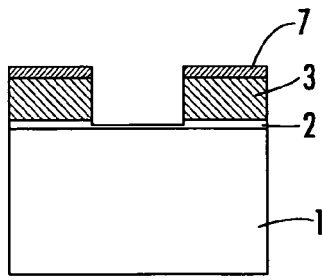
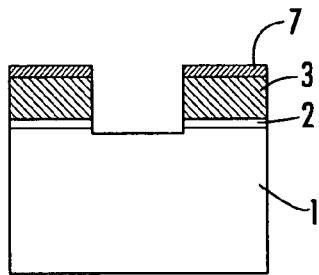
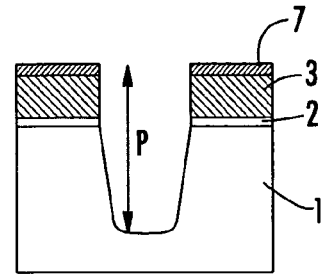
FIG. 31    FIG. 32    FIG. 33
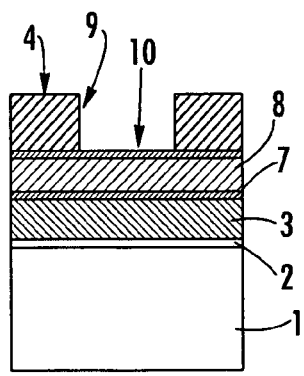
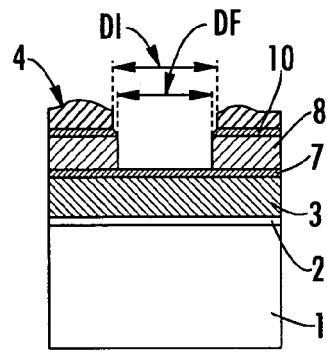
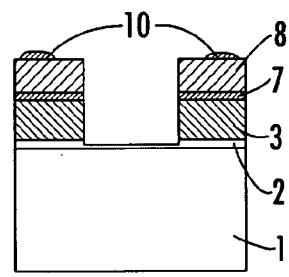
FIG. 34    FIG. 35    FIG. 36
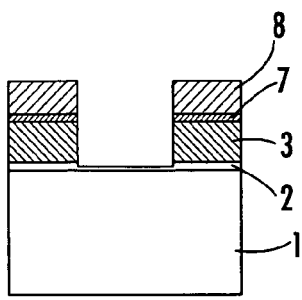
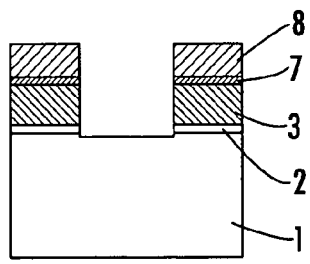
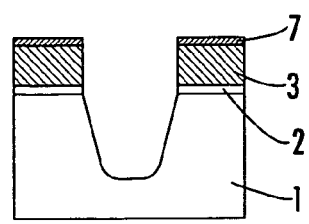
FIG. 37    FIG. 38    FIG. 39

METHOD FOR THE FABRICATION OF ISOLATION STRUCTURES

FIELD OF THE INVENTION

The present invention relates to a method for manufacturing insulating structures, and more particularly, but not exclusively, to a method for manufacturing STI insulating structures in memory devices. The following description is made with reference to this field of application for convenience of illustration only.

BACKGROUND OF THE INVENTION

A basic technological step for manufacturing integrated circuits includes manufacturing an insulating structure for allowing the different electronic components composing the circuit to be electrically separated. A local oxidation step of a silicon substrate should be performed, for a predetermined depth and width, so that the electrical charges generated by the electronic components are limited to very definite substrate areas.

Moreover, there is a general trend in microelectronics to provide a continuous reduction in the size of the different structures forming the integrated circuit. Therefore, the conditions for manufacturing insulating structures become more critical, especially from a geometric and size point of view.

The term STI (Shallow Trench Isolation) indicates a method for manufacturing an insulating structure suitable for technological generations below 0.25 µm. Referring to FIG. 1, the basic steps for manufacturing this kind of insulating structure are summarized below. In particular, a very thin oxide layer 2, called padox, being about 10 nm thick, is grown on a semiconductor substrate 1, whereon a silicon nitride layer 3 is grown, which is typically 100–200 nm thick. The nitride layer 3 serves as a stopping layer for the following planarizing treatments, while the oxide layer 2 is used as a buffer since the nitride layer 3 and the semiconductor substrate 1 have a very different network pitch.

Afterwards, a mask or resist layer 4 is formed on the nitride layer 3 through a traditional photolithographic technique, wherein openings 4' are defined and the nitride layer 3 and the padox layer 2 are removed in correspondence thereof. Through a following removal step, a trench 5 is then formed in the semiconductor substrate 1 in correspondence with these openings 4'. The trench 5 is formed with vertical walls, as shown in FIG. 2, or with sloping side walls with respect to the semiconductor substrate 1 surface, as shown in FIG. 3.

After etching and subsequently removing the resist mask 4, a CVD (Chemical Vapor Deposition) deposition step fills the trench 5 with a further oxide layer, not shown in the figures, which is then planarized by using CMP (Chemical Mechanical Polishing) technology.

The shape and the features of the trench 5 formed by plasma etching are thus very important. In fact the trench 5 depth, the shape thereof, the cross dimensions, and the roughness of the different surfaces have considerable implications on several parameters. These parameters include the following: the electric insulation effectiveness, the active area quality, the presence or absence of crystallographic dislocations, and the stability of following treatments.

During the semiconductor substrate 1 plasma etching, the resist layer 4 is also slowly removed. If this layer 4 is too thin, after plasma etching the final structure shows a different geometry with respect to the expected geometry, as shown in FIG. 3.

With respect to the STI insulation manufacturing, if the resist mask 4 is not sufficiently thick to mask the nitride layer 3 during the entire etching step for forming the trench 5, the nitride layer could be reduced in thickness. This would lead, after the CMP step and the thickening and wet etching steps, to a different insulating structure from the one obtained with a layer 3 having a completely regular shape of the nitride layer 3 during the entire etching step.

The resist layer 4 provides for a low side resistance to the plasma etching step. A low side resistance involves, during the etching step, a progressive erosion of the resist layer 4 perpendicularly to the etching direction. Subsequently, this leads to a reduction of the cross dimension of the layer 4 which serves to screen the etching.

As shown in FIGS. 4 to 9, the side dimension of the surface being exposed to the etching constantly increases. The areas covered by the resist layer 4 are progressively exposed to plasma and are thus etched. This derives first a sloped side profile of the nitride layer 3 with a subsequent side reduction (often considerable) of the structure final size f in the nitride layer 3 with respect to the starting size I which was to be defined, as evident from FIG. 9.

In the case of Flash memory cells formed by floating gate transistors and formed with an STI insulation, the manufacturing process is modified as shown in FIGS. 10 to 18. Through this process it is possible to form the floating gate region of floating gate transistors without using a supplementary mask, which could cause misalignment problems with the underlying structures. In particular, these figures are sectional views of a Flash memory portion in a perpendicular plane to the floating gate region direction.

The trench 5 is formed in the semiconductor substrate 1, as previously described. Due to the low side resistance of the resist layer 4, the nitride layer 3 formed on the semiconductor substrate 1 has sloped side walls after the etching step of the nitride layer 3, as shown in FIG. 10. In the Flash memory manufacturing process, after filling the trench 5 with an oxide layer 60 to form an insulating region, the nitride layer 3 is removed.

A semiconductor layer 70 called POLY1 is then formed, which is then planarized through CMP, as shown in FIG. 14. The oxide layer 60 is then partially removed to define floating gate regions. Two further layers are then formed. A first insulating layer 80 called ONO is formed, and a semiconductor layer 90 called POLY2 is formed. The entire stack comprising the semiconductor layer 90, the first insulating layer 80 and the semiconductor layer 70 is then etched through a three-step removal process of the layers POLY2/ONO/POLY1 to expose the substrate 1. It is essential that the etching of the POLY1 layer 70 is performed in a chemically selective way with respect to the insulating layer 80 to preserve a very thin gate oxide layer interposed between the POLY1 layer 70 and the semiconductor layer 1, which is not shown in the figures.

Nevertheless, as shown in FIG. 18, after etching the POLY1 layer 70 definite vertical portions 81 of the ONO layer 80 remain, which are indicated with the term "ONO fences". Since the side walls of the POLY1 layer 70 are not completely vertical, and since the vertical portions 81 are sloping with respect to the semiconductor 1 and they screen, when removing the polysilicon layers 70, 90, a portion of the POLY1 layer 70 thus generates a POLY1 residual 71 with a subsequent short circuit between two adjacent cells.

An important parameter of this memory device manufacturing method, called POLY CMP, is forming a nitride layer 3 whose side profile is vertical. In fact, the side profile of the obtained floating gate regions depends on the nitride layer 3 profile. It even practically takes the same shape thereof.

The problem linked to the low resistance of the resist layer 4, during a plasma removal step of layers underlying this resist layer 4, is more evident the more the memory device size is reduced, such as for example, when using a 193 nm photolithographic technique. In fact, one of the basic features of the photoresist layer being used in the 193 nm photolithographic technique is its low resistance to plasma etching. For the same chemistry being used, the etch rate is generally between 10% and 20% higher than the one being used with traditional photolithographic techniques, such as a 248 nm technique, for example.

This drawback is much more evident when considering the thickness of the resist layer. As the device size decreases, the resist layer should be even thinner to allow reduced-size geometric structures to be focused. For example, the thickness of the resist layer of 5400 Å used in the traditional 248 nm photolithographic technique ranges to a thickness of 3200 Å used in the 193 nm photolithographic technique.

The drawback linked to the low side resistance becomes more critical when etching materials for which a fluoride chemistry ($CF_4$, $CH_2F_2$, $CHF_3$, etc.) is required, such as silicon nitride ($Si_3N_4$) and silicon oxide ($SiO_2$) layers. In these cases, the etch rate increase is even higher, with values of about 25%–35%.

In the case of an etching step based on a fluoride chemistry, another parameter is very critical: the LER (Line Edge Roughness). Due to the LER, the upper profile of the nitride layer 3, forming the stopping layer, completely rectilinear after the lithography, is turned into a highly ragged profile, as shown in FIGS. 19 and 20.

A first known technical approach to address the above-mentioned problems and meet the need to protect the nitride layer 3 during the plasma etching step of the semiconductor substrate 1 is to interpose an oxide layer 6, called a hard mask, between the nitride layer 3 and the resist mask 4, as shown in FIGS. 21 to 24. Although advantageous under several aspects, this first approach does not succeed in solving the problems linked to the side etch rate and LER, since the etching of the nitride layer 3 is not selective with respect to the hard mask 6.

When two considerably thick layers are to be etched, such as for example, a 600 Å thermal oxide layer 6 and a 1600 Å nitride layer 3, with a necessarily fluorine-based chemistry, the problem of the very low side resistance to the nitride layer etching occurs in a particularly extreme form, even if this layer is protected by an oxide hard mask 6.

The use of the hard mask 6 depends on predetermined factors limiting the use modes of this mask. First of all, the chemistry used in the final part of the semiconductor substrate 1 etching should be selective thereon, otherwise its effectiveness would be limited. Moreover, the hard mask 6 should be formed using a material which can be easily removed (traditionally by wet etching) and without damaging structures which compose the final device. Such a method providing the use of a hard mask is not completely effective.

A further approach for solving the above-mentioned problems provides the use of a hard mask made of a metallic material, such as for example, tungsten, titanium and titanium nitride. In fact, it is possible to selectively etch the silicon nitride layer with respect to the metallic layer. Moreover, the metallic layer can be removed in a wet way.

This approach also has some drawbacks. All the final process steps for forming an electronic device called a frontend should be meticulously preserved from the risk of harmful metallic contaminations for the oxide layers. These oxide layers include the following: HV and LV gate layers, tunnel layer, ONO layer, and active areas, etc. Different technical approaches are involved which considerably increases the manufacturing method complexity.

SUMMARY OF THE INVENTION

An object of the present invention is to provide a method for forming insulating structures for allowing the vertical and side etch rate of the resist layer to be limited, thus overcoming the limits and drawbacks still affecting prior art methods.

This object is met by using a hard mask made of a highly selective material with respect to the other underlying layers in the manufacturing steps of insulating structures, particularly of the STI type.

More particularly, a method for manufacturing insulating structures in a semiconductor substrate is provided, wherein the method comprises forming a first insulating layer on the semiconductor substrate, forming a stop layer on the first insulating layer, and forming a barrier layer on the stop layer. The barrier layer may be selective with respect to the stop layer. A screen layer may be formed on the barrier layer. A portion of the screen layer may be selectively removed for forming an opening therethrough for exposing a portion of the barrier layer. The exposed barrier layer may be removed for exposing a portion of the stop layer. The exposed stop layer may be removed for exposing a portion of the semiconductor substrate. The method may further include removing the remaining barrier layer, and removing a portion of the exposed semiconductor substrate for forming a trench therein.

The method may further comprise removing the remaining screen layer when the exposed stop layer is removed. The method may also further comprise forming a second insulating layer on the stop layer before forming the barrier layer.

Removing the remaining barrier layer may be performed by plasma etching, which may be based upon a low polymerizing chemistry. The screen layer may comprise a resist layer. Removing the exposed barrier layer may be performed by a non-fluorine-based chemistry etching. The barrier layer may comprise a semiconductor layer, such as a polysilicon layer. The stop layer may comprise a nitride layer. The method may further comprise forming a supplementary layer on the barrier layer before forming the screen layer.

BRIEF DESCRIPTION OF THE DRAWINGS

The features and advantages of the method according to the invention will be apparent from the following description of an embodiment thereof given by way of non-limiting examples with reference to the attached drawings. In the drawings:

FIGS. 21 to 24 show a portion of a substrate during the manufacturing steps of a second method for forming STI insulating structures according to the prior art.

FIGS. 25 to 30 show a portion of a substrate during the manufacturing steps of a first method for forming STI insulating structures according to the invention.

FIGS. 31 to 33 show a portion of a substrate during the manufacturing steps of a second method for forming STI insulating structures according to the invention.

FIGS. 34 to 39 show a portion of a substrate during the manufacturing steps of an alternative embodiment of the method according to the invention for forming STI insulating structures.

DETAILED DESCRIPTION OF THE PREFERRED EMBODIMENTS

Figure 1:
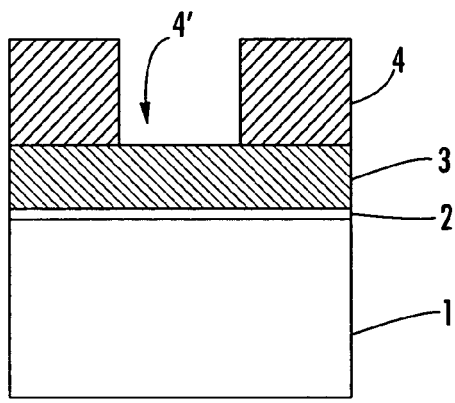
FIGS. 1 to 3 show a portion of a substrate during the manufacturing steps of a first method for forming STI insulating structures according to the prior art.
Figure 2:
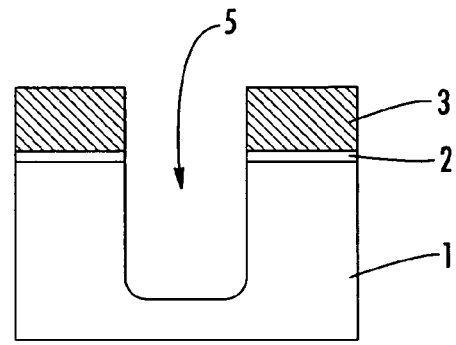
Figure 3:
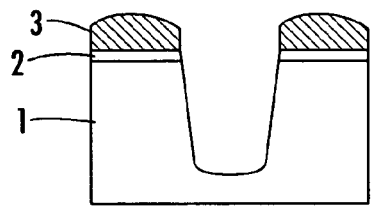
Figure 4:
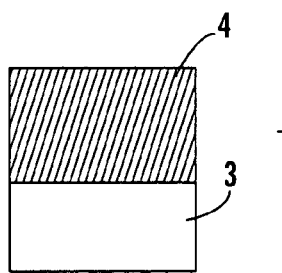
FIGS. 4 to 9 show a resist layer partially masking a semiconductor layer during a semiconductor layer etching step according to the prior art.
Figure 5:
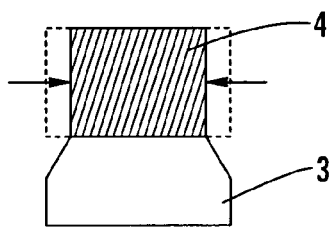
Figure 6:
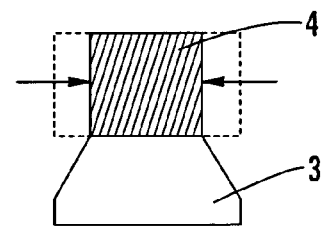
Figure 7:
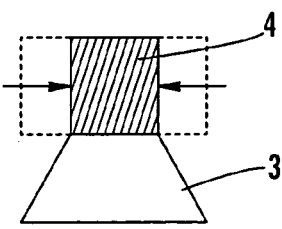
Figure 8:
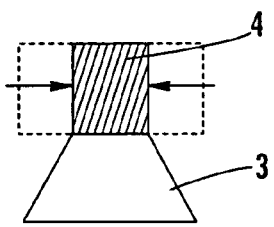
Figure 9:
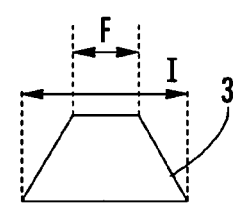
Figure 10:
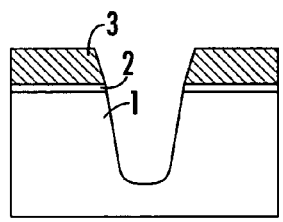
FIGS. 10 to 18 show a portion of a substrate during the manufacturing steps of a non-volatile memory device after forming STI insulating structures according to the prior art.

The process steps described below do not form a complete process flow for manufacturing integrated circuits. The present invention can be implemented together with the integrated circuit manufacturing techniques presently used in this field, and only those commonly used process steps which are necessary to understand the present invention are in the description.

The figures representing cross sections of portions of an integrated circuit during the manufacturing are not drawn to scale. They are instead drawn to show the important features of the invention. With reference to FIGS. 25 to 30, a first embodiment of the method for manufacturing insulating structures according to the invention, particularly of the STI type, is described. For convenience of illustration, elements being structurally and functionally similar to the prior art will be given the same reference numerals.

A first insulating layer 2, for example a very thin oxide layer, being about 10 nm thick, is formed on a semiconductor substrate 1, whereon a stopping layer 3 is formed, for example a silicon nitride layer, being traditionally 100–200 nm thick. The stopping layer 3 serves as a barrier for the following planarization treatments, while the insulating layer 2 is used as a buffer since the stopping layer 3 and the semiconductor substrate 1 generally have a very different network pitch.

According to the invention, a barrier layer 8 or hard mask is formed on the stopping layer 3. Advantageously, the barrier layer 8 is formed with a material having a good selectivity with respect to the stopping layer 3. Advantageously, the barrier layer 8 is formed with a material which can be etched by a non-fluorine-based chemistry. Also advantageously, according to the invention, the hard mask 8 can be removed in a step following a definition step of the stopping layer 3.

In a preferred embodiment, described below by way of a non-limiting example, the barrier layer 8 is formed with a semiconductor layer, for example polysilicon. Advantageously, a second very thin insulating layer 7, for example silicon oxide, is interposed between the semiconductor layer 8 and the stopping layer 3.

Advantageously, the second insulating layer 7 is 150 Å thick and the semiconductor layer 8 is 1000 Å thick. In particular, this semiconductor layer 8 is used as a hard mask for the following etching steps of the semiconductor substrate 1, and thus this semiconductor layer 8 should be thick. The thickness thereof is thus advantageously within a range between 80 Å and 2000 Å.

Afterwards, a mask 4 or screening layer, for example a resist layer, is formed through a traditional photolithographic technique on the semiconductor layer 8, wherein openings 9 are defined. As shown in FIG. 26, the semiconductor layer 8 is then etched with a first removal step through the openings 9 to expose a portion of the second insulating layer 7.

The second insulating layer 7 and the stopping layer 3 are then etched with a second removal step. Advantageously according to the invention, the second removal step is highly selective with respect to the semiconductor layer 8, as shown in FIG. 27, and is capable of removing the screening layer 4.

In this second etching step a fluorocarbon of the $C_xH_yF_z$ type is used, whose selectivity is commonly determined by the ratio between the indexes Z/X. The lower this ratio, the lower is the etch rate on the semiconductor layer 8, particularly polysilicon (thus, the selectivity is high) and vice-versa. For example, by etching with a $CH_3F$-based chemistry a very good selectivity on the semiconductor layer would be obtained. On the contrary, by etching with a $CF_4$ the semiconductor layer 8 would also be rapidly removed because of the selectivity that is lacking on this layer.

According to the invention, by forming a hard mask in the semiconductor layer 8, all the effects of the poor etching side resistance, the excessive resist wear, and the LER is considerably reduced since it is just the semiconductor layer 8 to act as a mask during the etching step of the stopping layer 3 and not the resist screening layer 4.

At this point of the manufacturing process the semiconductor layer 8 is removed. Advantageously, in the method according to the invention, the semiconductor layer 8 removal is performed by chemical etching. In fact, this semiconductor layer 8, having to serve as a hard mask, considerably thick and other removal techniques such as CMP for example, are not suitable. In particular, through the CMP technique a very long overetch should be used, which would damage the entire device planarization due to the etch rate difference between the semiconductor layer 8 and the second insulating layer 7.

A first embodiment of the method according to the invention to remove the semiconductor layer 8 is shown in FIG. 29, wherein the insulating layer 2 is removed first and then the semiconductor layer 8 is removed and the semiconductor substrate 1 is simultaneously etched to form a trench 5 within the semiconductor substrate 1. Advantageously, the etching step of the semiconductor substrate 1 and of the semiconductor layer 8 is performed by plasma etching.

Advantageously, the chemistry by which the formation of the trench 5 in the semiconductor substrate 1 and the removal of the semiconductor layer 8 are performed, for example $HBr/O_2$, are highly selective both on the oxide layer 2 and on the nitride layer 3. Therefore, after removing the whole semiconductor layer 8, the second insulating layer 7 will still serve as a hard mask for the underlying layers.

Moreover, by using a plasma etch for removing the semiconductor layer 8, the plasma undergoes a variation in its chemical composition. In fact, before wearing the semiconductor material hard mask 8, silicon-based reaction products are the great majority and they come from the trench 5 in the semiconductor substrate 1 and from the semiconductor layer 8, while after wearing the semiconductor material hard mask 8, they considerably decrease since the contribution deriving from the semiconductor layer 8 removal is missing. To avoid the chemical variation from affecting the shape of the trench 5, an optimization of the parameters of the trench etching step is performed. Low polymerizing chemistry is very effective in this regard.

A second embodiment of the method for removing the semiconductor material hard mask 8 provides the same process steps of the previous embodiment until the selective removal of the nitride layer 3, then the methods continues with a semiconductor layer 8 etching step. This etching step is highly selective with respect to oxide and nitride. Afterwards, this latter etching step is followed by a very short removal step of the layer 2 to expose the semiconductor substrate 1 and preserve the second insulating layer 7 on the nitride layer 3. Then it continues with the trench 5 etching, as shown in FIG. 32.

An important advantage offered by the polysilicon hard mask 8 is given by the possibility to form lower-sized openings 9 with respect to photolithographic ones. In particular, with reference to FIGS. 34 to 39, an alternative embodiment of the method according to the invention is described, wherein a supplementary layer 10, for example a BARC layer, is formed between the resist layer 4 and the semiconductor layer 8.

Etching of the supplementary layer 10 is performed through the openings 9 with a very polymerizing chemistry to obtain a trench in the supplementary layer 10 to expose the semiconductor layer 8. The side walls of the trench in the supplementary layer 10 are formed substantially sloped to reduce the size DF of the exposed semiconductor layer 8 with respect to the size DI of the opening 9, as shown in FIG. 35.

These sloped walls are formed by polymeric-material spacing elements which are formed during the plasma etching step of the supplementary layer 10. The sloped walls mask the semiconductor layer 8 during etching when the etching chemistry does not comprise fluorine which would remove the organic-polymer spacing elements, thus returning to the original size. Therefore, the active area size can be controlled with great accuracy.

The method according to the invention is completed by the modes being already described for the previous embodiments. In conclusion, the method according to the invention allows the hard mask 8 to be removed in situ, i.e., during the same semiconductor substrate 1 etching to form the STI structure or by adding a suitable step before the etching to form the STI structure.

Figure 11:
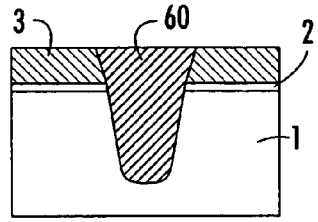
Figure 12:
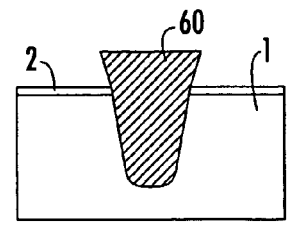
Figure 13:
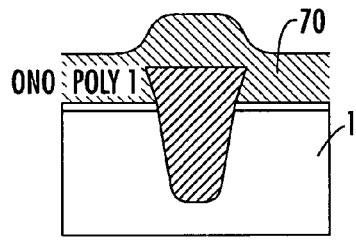
Figure 14:
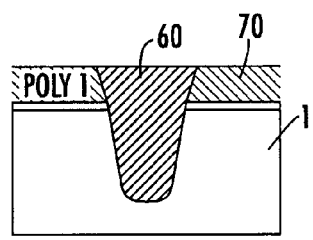
Figure 15:
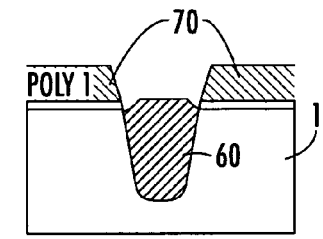
Figure 16:
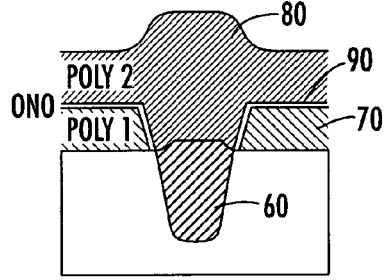
Figure 17:
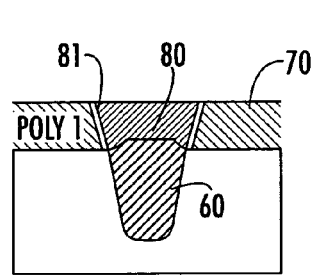
Figure 18:
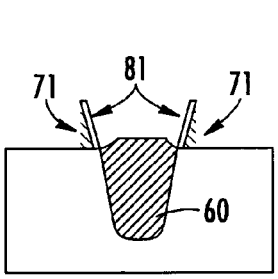
Figure 19:
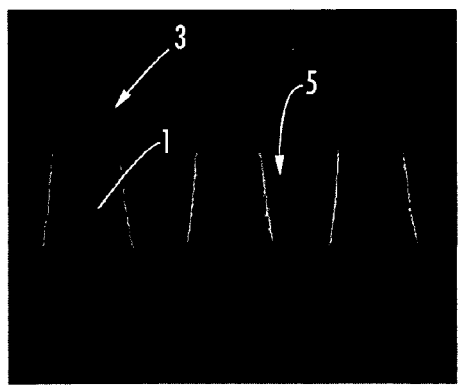
FIG. 19 is a picture of the schematic image of FIG. 8.
Figure 20:
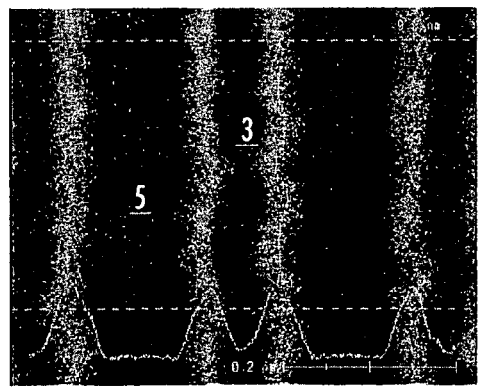
FIG. 20 is a view from above of FIG. 19.
Figure 40:
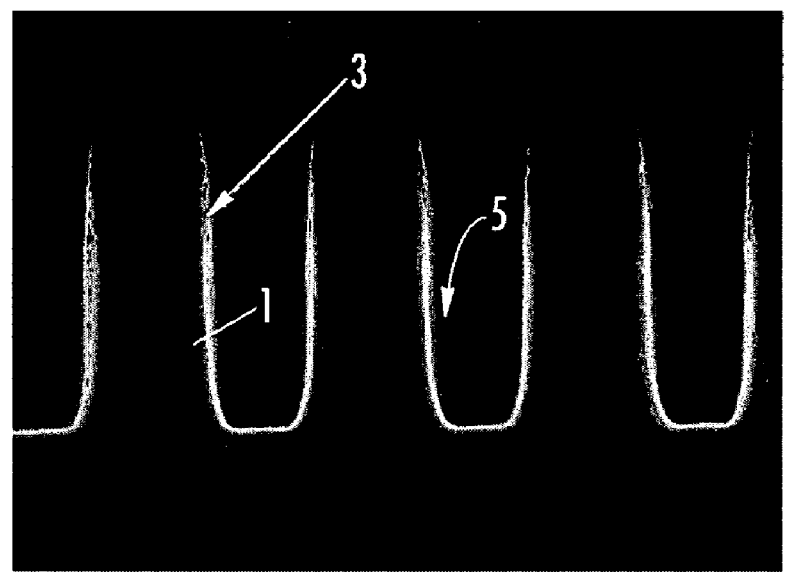
FIG. 40 is a picture of the schematic image of FIG. 30.
Figure 41:
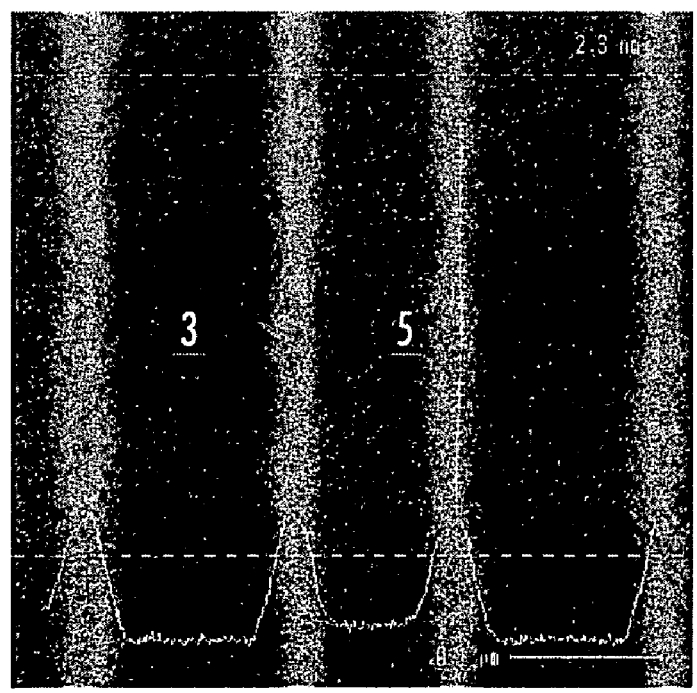
FIG. 41 is a view from above of FIG. 40.

This allows a trench 5 to be formed in the semiconductor substrate 1 whose depth/amplitude [aspect ratio] is far lower for the same depth P of the trench 5 than the prior art. In fact, by removing the hard mask 8 in situ, the total depth of the trench 5 is lower. This allows the trench 5 filling processes, which is very critical, like the ones shown in FIG. 11, to be favored. In the prior art, a trench is filled, having the same length, but is deeper because of the thickness of the hard masks on the layers to be removed. It is thus possible to have a predetermined active area size, with the profile of the nitride layer 3 being more vertical with respect to the semiconductor substrate 1, as shown in FIG. 40, and a considerable LER improvement, as shown in FIG. 41.

That which is claimed is:

1. A method for manufacturing insulating structures in a semiconductor substrate comprising;
    forming a first insulating layer on the semiconductor substrate;
    forming a stop layer on the first insulating layer;
    forming a barrier layer on the stop layer, the barrier layer being selectively removable with respect to the stop layer;
    forming a screen layer on the barrier layer;
    selectively removing a portion of the screen layer for forming an opening therethrough for exposing a portion of the barrier layer;
    removing the exposed barrier layer for exposing a portion of the stop layer;
    removing the exposed stop layer for exposing a portion of the semiconductor substrate;
    removing the remaining barrier layer and, at a same time, removing a portion of the exposed semiconductor substrate for forming a trench therein.

2. A method according to claim 1, further comprising removing the remaining screen layer when the exposed stop layer is removed.

3. A method according to claim 1, further comprising forming a second insulating layer on the stop layer before forming the barrier layer.

4. A method according to claim 1, wherein removing the remaining barrier layer is performed by plasma etching.

5. A method according to claim 4, wherein the plasma etching is performed with a low polymerizing chemistry.

6. A method according claim 1, wherein the screen layer comprises a resist layer.

7. A method according to claim 1, wherein removing the exposed barrier layer is performed by a non-fluorine-based chemistry etching.

8. A method according to claim 1, wherein the barrier layer comprises a semiconductor layer.

9. A method according to claim 8, wherein the semiconductor layer comprises a polysilicon layer.

10. A method according to claim 1, wherein the stop layer comprises a nitride layer.

11. A method according to claim 1, further comprising forming a supplementary layer on the barrier layer before forming the screen layer.

12. A method for manufacturing insulating structures in a semiconductor substrate comprising:
    forming a first insulating layer on the semiconductor substrate;
    forming a stop layer on the first insulating layer;
    forming a barrier layer on the stop layer, the barrier layer being selectively removable with respect to the stop layer;
    forming a screen layer on the barrier layer;
    selectively removing a portion of the screen layer for forming an opening therethrough for exposing a portion of the barrier layer;
    removing the exposed barrier layer for exposing a portion of the stop layer;
    removing the exposed stop layer for exposing a portion of the semiconductor substrate;
    removing the remaining barrier layer; removing a portion of the exposed semiconductor substrate for forming a trench therein; and
    forming a second insulating layer on the stop layer before forming the barrier layer.

13. A method according to claim 12, wherein the barrier layer comprises a semiconductor layer.

14. A method for manufacturing insulating structures in a semiconductor substrate comprising:
    forming a first insulating layer on the semiconductor substrate;
    forming a stop layer on the first insulating layer;

forming a barrier layer on the stop layer, the barrier layer comprising a semiconductor layer and being selectively removable with respect to the stop layer;

forming a screen layer on the barrier layer;

selectively removing a portion of the screen layer for forming an opening therethrough for exposing a portion of the barrier layer;

removing the exposed barrier layer for exposing a portion of the stop layer;

removing the exposed stop layer for exposing a portion of the semiconductor substrate;

removing the remaining barrier layer; and removing a portion of the exposed semiconductor substrate for forming a trench therein.

15. A method according to claim 14, wherein the semiconductor layer comprises a polysilicon layer.

* * * * *